US008409450B2

(12) United States Patent
Zettl et al.

(10) Patent No.: US 8,409,450 B2
(45) Date of Patent: Apr. 2, 2013

(54) GRAPHENE-BASED STRUCTURE, METHOD OF SUSPENDING GRAPHENE MEMBRANE, AND METHOD OF DEPOSITING MATERIAL ONTO GRAPHENE MEMBRANE

(75) Inventors: Alexander K. Zettl, Kensington, CA (US); Jannik Christian Meyer, Ulm (DE)

(73) Assignee: The Regents of the University of California, Oakland, CA (US)

( * ) Notice: Subject to any disclaimer, the term of this patent is extended or adjusted under 35 U.S.C. 154(b) by 865 days.

(21) Appl. No.: 12/409,938

(22) Filed: Mar. 24, 2009

(65) Prior Publication Data
US 2009/0291270 A1 Nov. 26, 2009

Related U.S. Application Data

(60) Provisional application No. 61/039,002, filed on Mar. 24, 2008.

(51) Int. Cl.
*C03C 25/68* (2006.01)
(52) U.S. Cl. .................. 216/7; 216/40; 216/54; 216/97; 977/734; 977/763
(58) Field of Classification Search ............... 216/7, 40, 216/54, 97; 977/734, 763
See application file for complete search history.

(56) References Cited

U.S. PATENT DOCUMENTS

| | | | | |
|---|---|---|---|---|
| 5,004,920 | A * | 4/1991 | Lee et al. | 250/304 |
| 2003/0138973 | A1 * | 7/2003 | Wagner et al. | 436/518 |
| 2010/0143726 | A1 * | 6/2010 | Golzhauser et al. | 428/446 |
| 2010/0260317 | A1 * | 10/2010 | Chang et al. | 378/62 |

FOREIGN PATENT DOCUMENTS

| | | |
|---|---|---|
| DE | 102007016995 A1 | 10/2008 |
| DE | 102007016995 A1 * | 10/2008 |

OTHER PUBLICATIONS

Masa et al. ("Atomic Structure of Graphene on SiO2", Nano Letters; vol. 7, No. 6; pp. 1643-1648; 2007).*
Van Dorp et al., "One nanometer structure fabrication using electron beam induced deposition," Microelectronic Engineering, vol. 83, pp. 1468-1470, (Feb. 20, 2006).
Meyer et al., "The structure of suspended graphene sheets," Nature, vol. 446, pp. 60-63, Including Supplementary Information pp. 1-5, (Mar. 2007).
Nordlund et al., "Formation of Ion Irradiation Induced Small-Scale Defects on Graphite Surfaces," Physical Review Letters, vol. 77, No. 4, pp. 699-702, (Jul. 22, 1996).

(Continued)

*Primary Examiner* — Binh X Tran
(74) *Attorney, Agent, or Firm* — Technology Transfer and Intellectual Property Management Department (57) ABSTRACT

An embodiment of a method of suspending a graphene membrane across a gap in a support structure includes attaching graphene to a substrate. A pre-fabricated support structure having the gap is attached to the graphene. The graphene and the pre-fabricated support structure are then separated from the substrate which leaves the graphene membrane suspended across the gap in the pre-fabricated support structure. An embodiment of a method of depositing material includes placing a support structure having a graphene membrane suspended across a gap under vacuum. A precursor is adsorbed to a surface of the graphene membrane. A portion of the graphene membrane is exposed to a focused electron beam which deposits a material from the precursor onto the graphene membrane. An embodiment of a graphene-based structure includes a support structure having a gap, a graphene membrane suspended across the gap, and a material deposited in a pattern on the graphene membrane.

17 Claims, 6 Drawing Sheets

OTHER PUBLICATIONS

Jeloaica et al., "DFT investigation of the adsorption of atomic hydrogen on a cluster-model graphite surface," Chemical Physics Letters, vol. 300, pp. 157-162, (Jan. 29, 1999).

Doyle et al., "Relativistic Hartree-Foek X-ray and Electron Scattering Factors," Acta Crystallographica Section A, vol. 24, pp. 390-397, (1968).

Peng, "Electron atomic scattering factors and scattering potentials of crystals," Micron, vol. 30, pp. 625-648, (1999).

Pacile et al., "The two-dimensional phase of boron nitride: Few-atomic-layer sheets and suspended membranes" Applied Physics Letters, vol. 92, pp. 133107-1-133107-3, (2008).

Meyer et al., "Imaging and dynamics of light atoms and molecules on graphene," Nature, vol. 454, pp. 319-322, (Jul. 17, 2008).

Eck et al., "Freestanding Nanosheets from Crosslinked Biphenyl Self-Assembled Monolayers," Advanced Materials, vol. 17, pp. 2583-2587, (2005).

Meitl et al., "Transfer printing by kinetic control of adhesion to an elastomeric stamp," Nature Materials, vol. 5, No. 1, pp. 33-38, (Jan. 2006).

Liang et al., "Graphene Transistors Fabricated via Transfer-Printing in Device Active-Areas on Large Wafer," Nano Letters, vol. 7, No. 12, pp. 3840-3844, (2007).

* cited by examiner

GRAPHENE-BASED STRUCTURE, METHOD OF SUSPENDING GRAPHENE MEMBRANE, AND METHOD OF DEPOSITING MATERIAL ONTO GRAPHENE MEMBRANE

RELATED APPLICATIONS

This application claims priority to and the benefit of U.S. Provisional Application No. 61/039,002, filed on Mar. 24, 2008, which is hereby incorporated by reference.

STATEMENT OF GOVERNMENTAL SUPPORT

This invention was made with government support under Contract No. DE-AC02-05CH11231 awarded by the U.S. Department of Energy. The government has certain rights in this invention.

FIELD OF THE INVENTION

This invention relates generally to graphene.

BACKGROUND OF THE INVENTION

Graphene is a single planar sheet of sp3-bonded carbon atoms that are densely packed in a honeycomb crystal lattice and which was first isolated in 2004. The carbon-carbon bond length in graphene is approximately 1.42 Å. Since the experimental verification the following year of many of its theoretically predicted electronic properties, single- and few-layer graphene has been suggested as a promising candidate material for future microelectronic devices. Graphene is in many respects similar to carbon nanotubes, but expectations are that for various applications graphene will be easier to control. This is partly because it can be patterned into arbitrary shapes by lithographic means which readily provides a degree of control difficult to achieve with nanotubes.

Nevertheless, smaller devices require not only novel materials but also a means of shaping those materials into a tiny circuit. State of the art, resist based, electron beam lithography (EBL) methods, notwithstanding throughput issues, rarely achieve a half-pitch of less than 20 nm on bulk substrates. Smaller features, if created by EBL, are in most cases of a special shape, e.g., an isolated line. It has been argued that resist-based EBL on a substrate is inherently limited to around 20 nm half-pitch for periodic patterns. Although electron beams can be focused to sub-angstrom diameters, scattered and secondary electrons generated in a bulk substrate and resist limit the modulation in the energy profile that can ultimately realized. Accordingly, the smallest feature sizes using EBL having not improved significantly over the last three decades.

On bulk substrate, the spatial resolution of electron-beam induced deposition (EBID) and also of convention lithography is limited by scattered and secondary electrons, with a minimum half pitch of around 20 nm. Good resolution has been achieved by EBID on ultrathin amorphous carbon and silicon nitride membranes (see, e.g., van Dorp, W. F., et al., One nanometer structure fabrication using electron beam induced deposition, *Microelectronic Eng.*, 83, 1468-1470 (2006)).

An existing technique for producing a suspended graphene membrane is taught in Meyer, J. C., et al., The structure of suspended graphene sheets, *Nature*, 446, 60-63 and in the supplementary information to this publication (doi: 10.1038/nature05545). In this technique, graphene flakes are placed on an oxidized surface of a silicon wafer upon which a metal grid is produced by deposition of a metal, electron beam lithography, and etching.

Graphene holds potential for novel electronic, thermal and mechanical devices. Many devices currently made use graphene adhered to a substrate. However, for many potential applications, a suspended membrane of graphene is essential, such as for nanoelectromechanical devices. While there is the existing technique for producing suspended graphene that is discussed above, it is complicated and consequently expensive. A more efficient and less expensive technique is desirable. Further, graphene is useful for many devices as it has a high conductivity and is sensitive to "gating". However, a new form of lithography is needed to make extremely small devices on graphene.

SUMMARY OF THE INVENTION

An embodiment of a method of suspending a graphene membrane across a gap in a support structure of the present invention includes attaching graphene to a substrate. A pre-fabricated support structure having the gap is attached to the graphene. The graphene and the pre-fabricated support structure are then separated from the substrate which leaves the graphene membrane suspended across the gap in the pre-fabricated support structure. In an embodiment, the method includes separating the graphene from bulk graphite prior to attaching the graphene to the substrate.

According to an embodiment, attaching the pre-fabricated support structure includes placing a pre-fabricated support structure having the gap on the graphene; immersing the pre-fabricated support structure and the graphene in a solvent, and evaporating the solvent which attaches the pre-fabricated support structure to the graphene.

According to an embodiment, the graphene is attached to a sacrificial surface of the substrate. The graphene and the pre-fabricated support structure may be separated from the substrate by etching the sacrificial surface, which may be accomplished by immersing the sacrificial surface and the graphene in an etch solution. In an embodiment, the sacrificial surface includes silicon dioxide. For this embodiment, the etch solution includes potassium hydroxide or another suitable solvent. In another embodiment, the sacrificial surface includes polymethyl methacrylate and the etch solution includes an organic solvent. The organic solvent may be selected from acetone, methylpyrrolidone, or another suitable solvent.

According to an embodiment, separating the graphene and the pre-fabricated support structure from the substrate includes placing a solvent adjacent to an edge of the pre-fabricated support structure. The solvent expands beneath the pre-fabricated support structure and the graphene, which causes the pre-fabricated support structure with the graphene membrane suspended across the gap to release from the substrate.

According to an embodiment, attaching the pre-fabricated support structure to the graphene includes applying an adhesive to a surface of the pre-fabricated support structure and bringing the adhesive into contact with the graphene. In such an embodiment, the graphene and the pre-fabricated support structure may be separated from the substrate by pulling the pre-fabricated support structure away from the substrate, which leaves the graphene attached to the pre-fabricated support structure by the adhesive. This embodiment may include immersing the graphene and the pre-fabricated support structure in a solvent to remove excess adhesive.

According to an embodiment, the method may further include heating the pre-fabricated support structure having the graphene membrane suspended across the gap after separating the pre-fabricated support structure and the graphene membrane from the substrate.

According to embodiments, the pre-fabricated support structure may be a TEM (transmission electron microscopy) grid. According to an embodiment, the pre-fabricated support structure may include a plurality of gaps. In such an embodiment, separating the graphene and the pre-fabricated support structure from the substrate may leave the graphene membrane suspended across at least two of the gaps in the pre-fabricated support structure. According to an embodiment, attaching the pre-fabricated support structure to the graphene includes attaching the pre-fabricated support structure to the substrate beyond where the pre-fabricated support structure attaches to the graphene.

An embodiment of a method of depositing material of the present invention includes placing a support structure having a graphene membrane suspended across a gap under vacuum. A precursor is adsorbed to a surface of the graphene membrane. A portion of the graphene membrane is exposed to a focused electron beam which deposits a material from the precursor onto the graphene membrane.

According to embodiments, adsorbing the precursor to the surface of the graphene membrane may take place prior to, while, or after placing the support structure having the graphene membrane under the vacuum.

According to an embodiment, exposing the portion of the graphene membrane to the focused electron beam causes amorphous carbon to be deposited onto the graphene membrane. According to another embodiment, exposing the portion of the graphene membrane to the focused electron beam causes a dopant to be deposited onto the graphene membrane.

According to an embodiment, the method of depositing the material further includes raster scanning the electron beam across the graphene membrane to produce a pattern of the material on the graphene membrane. In an embodiment, the pattern forms an electronic device on the graphene membrane. In another embodiment, the pattern forms a plurality of local perturbations on a nanometer scale on the graphene membrane. in yet another embodiment, the pattern forms an etch mask for further processing of the graphene membrane.

An embodiment of a graphene-based structure of the present invention includes a support structure having a gap, a graphene membrane suspended across the gap, and a material deposited in a pattern on the graphene membrane. In an embodiment, the material includes carbon. In an embodiment, the pattern comprises a feature dimension of less than about 2.5 nm.

BRIEF DESCRIPTION OF THE DRAWINGS

The foregoing aspects and others will be readily appreciated by the skilled artisan from the following description of illustrative embodiments when read in conjunction with the accompanying drawings.

FIG. 1 provides optical microscopy images taken in the course of preparation of a suspended graphene membrane. Panel (a): Optical micrograph of a flake on a Si/SiO2 substrate. Panel (b): Quantifoil™ grid on top of the graphene flake, immersed in isopropanol. Color rings appear just before the liquid is completely evaporated as the perforated carbon film is pulled into contact with the surface. Panel (c): Quantifoil™ (with perforated carbon film) on the graphene flake. Panel (d): Free hanging flake (low-magnification TEM image) after release from the substrate. Spacing (period) of the holes is 2.5 µm. The dashed-line circles in Panels (a) and (d) indicate the single-layer region of this sample. Scale bars are (a) 2 µm, (b) and (c) 10 µm, and (d) 5 µm.

FIG. 2 provides electron microscopy images taken of a graphene membrane. Panel (a): A free-standing membrane spanning a 1.3 µm hole in a TEM grid. Panel (b): The same membrane after electron-beam induced deposition of a dot array on part of the area. Panel (c): Lawrence Berkeley National Laboratory logo written onto graphene. Panel (d): Pattern with 2.5 nm half pitch (5 nm dot separation). Panel (e): Lines in the logo (windows of the clock tower at top right) spaced 10 nm apart. Panel (f): Intensity profile of the electron beam that was used to write these structures. Scale bars are (b) and (c) 100 nm, and (d) 20 nm.

FIG. 4 provides TEM images of a graphene membrane. (a) Low magnification overview image of a suspended graphene sheet on the perforated carbon foil. (b) High resolution close-up of a graphene membrane. We observe small, extremely clean areas with diameters of ten to fifty nanometers where no contrast is visible, separated by regions with thin amorphous adsorbates. Scale bars are (a) 1 µm and (b) 10 nm.

FIG. 5 provides adatom images. (a) Carbon adatom (black arrow). (b) Intensity profiles from several images of the carbon adatom (black), and a simulated profile (red). Inset in (b) shows the simulated image. (c) Carbon adatom configuration (according to Nordlund et al., Formation of ion irradiation induced small-scale defects on graphite surfaces, *Phys. Rev. Lett.*, 77, 699 (1996)). (d) Hydrogen adatoms on the same sample (dark grey spots), a selection of which are indicated by a red arrow. The profile plots are shown in (e). Black arrow in (d) is again the carbon adatom. Red line in (e) is the simulated profile for a hydrogen adatom. (f) Configuration of a chemisorbed hydrogen atom (according to Jeloaica and Sidis, DFT investigation of the adsorption of atomic hydrogen on a cluster-model graphite surface, *Chem. Phys. Lett.*, 300, 157 (1999)). All scale bars are 2 nm.

FIG. 6 provides TEM images showing dynamics of defects. (a-c) Generation of vacancies due to electron irradiation. Time between (a) and (c) is 50 minutes. (d-f) Annealing of a vacancy by interaction with an adsorbate. We observe two individual vacancies (d), and then (e) trapping of a larger adsorbate, corresponding to a mass of a few carbon atoms, on one of the defects. After ca. 5 minutes, both the adsorbate and the one vacancy disappear (f), showing that the missing carbon atom in the graphene sheet has been replaced by an atom from the adsorbate. Scale bar is 2 nm.

FIG. 7 provides TEM images showing molecular scale adsorbates. (a) Molecule suspended between other adsorbates (arrow). (b-d) Migration of a carbon chain, where one end remains attached in each step. The contrast is in agreement with an alkane molecule. Scale bar is 2 nm.

DETAILED DESCRIPTION

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a membrane" includes a plurality of such membranes, and so forth.

These and other objects, advantages, and features of the invention will become apparent to those persons skilled in the art upon reading the details of the invention as more fully described below.

Electron-Beam Induced Deposition on Graphene Membranes

The invention provides a method of preparing a suspended graphene membrane. The method is compatible with various processing methods, and transmission electron microscopy (TEM). Graphene is first provided on a silicon substrate with a silicon dioxide layer. Then a grid material, such as a Quantifoil™ electron microscopy grid, is placed on the graphene and immersed in a solvent. As the solvent evaporates, the grid is pulled into close contact with the substrate and the graphene membrane. The contact between the Quantifoil™ grid and the graphene membrane can be further improved by heating the sample.

The present invention also provides a graphene-based structure comprising a graphene membrane and a material in a pattern, where the pattern may have a resolution of less than about 2.5 nm on said graphene. In some embodiments, the resolution is 2.0 nm or less, 1.5 nm or less, or 1.0 nm or less. The deposited material can be amorphous carbon. The deposited material can be produced using any suitable means, such as using a focused electron beam. A focused electron beam can be scanned across the graphene and causes the deposition of amorphous carbon. This effect is known as electron-beam induced deposition (EBID).

In contrast to amorphous thin films, graphene has interesting electronic properties that can be significantly altered directly by doping, shaping or defect generation. By using graphene membranes, one skilled in the art can directly pattern the material for next generation of electronic devices. Doping patterns can be deposited ion order to define electronic circuits by a suitable choice of precursor for EBID. Also, the arbitrary design of local perturbations with nanometer precision allows for the scattering and diffraction of relativistic quasiparticles, since the electron wavelength in graphene is comparable to the spacing of the dots. This leads to novel electronic and thermal devices with direct applications in the electronics.

In some embodiments, a simple periodic superlattice leads to a gap in the density of states. More elaborate patterns can be designed as waveguides or to obtain localized states. Local changes in the electronic properties around or within a controlled pattern of defects can be explored by scanning electron microscopy or scanning tunneling microscopy. In addition, the deposited carbon on the graphene membrane can serve as an etch mask or for data storage.

The present invention provides for a direct-write deposition method for arbitrary patterns on suspended graphene membranes with a resolution (half-pitch) of 2.5 nm or less. These patterns can serve as an etch mask, or to create a doping pattern. In addition, the arbitrary design of local perturbations with nanometer precision can allow a wide range of experiments that explore the scattering and diffraction of relativistic quasiparticles. The invention provides for a novel, simple and efficient process to obtain a free-standing graphene membrane, and for a method to facilitate the high-resolution patterning of such a free-standing graphene membrane.

The resolution restrictions of EBL from profile broadening on a bulk substrate have been explored previously by electron-beam induced deposition (EBID) on ultra-thin substrates. In particular, electron-beam induced deposition with small feature sizes has been previously demonstrated on amorphous carbon films and silicon nitride membranes with a thickness of 10 nm and 30 nm, respectively. It has also been demonstrated that a range of materials other than amorphous carbon can be deposited by careful control of the precursor. In fact, calculations show that high resolution should be possible by EBID on any thickness of substrate; however, the tails of deposited spots (deposited material outside of the beam) is suppressed on ultra-thin membranes. The membranes of the present invention are another one to two orders of magnitude thinner than previously studied membranes, thereby reducing the effects of secondary and scattered electrons even further. Indeed, the minimum feature size of the membranes of the present invention corresponds to the diameter of the focused electron beam, and no deposition is observed outside the deposited structures.

An important difference between using an amorphous film substrate, and graphene, for patterning is that graphene has remarkable electronic properties that can be significantly altered directly by doping, shaping or defect generation. A graphene membrane can be directly patterned using the deposition method of the present invention to produce a host of next generation electronic devices.

Method of Suspending the Graphene Membrane

The present invention provides for a method of suspending a graphene membrane from a support structure. The method comprises first providing graphene, such as a graphene flake made by the well-known "scotch tape" method. The graphene is transferred to a substrate or solid support comprising one or more holes, openings or perforations, such as an electron microscopy grid. A suitable electron microscopy grid is a commercially available electron microscopy grid, such as a Quantifoil™ 200 Mesh gold grids with 1.3 μm holes in the carbon film.

In some embodiments of the method, the graphene provided is a graphene flake on a silicon substrate with a 300 nm thick silicon dioxide layer. The graphene flake can be identified by optical microscopy. A Quantifoil™ grid is placed on the flake. A small drop of a suitable solvent, such as an organic solvent as isopropanol, is added to the flake and allowed to completely evaporate. The surface tension of the solvent during evaporation pulls the perforated carbon film into contact with the substrate (or solid support) and the graphene flake. The adhesion of the flake to the substrate or solid support can be improved by heating the flake, such as to a temperature of about 200° C. for 5 minutes. Heating can be by any suitable means, such as a hot plate. The flake is then allowed to cool. After cooling, the substrate with the now well-sticking TEM grid into a 30% solution of semiconductor grade potassium hydroxide at room temperature. The silicon dioxide layer is slowly etched by the potassium hydroxide, and the TEM grid along with the graphene sheets falls off after a time ranging from a few minutes to a few hours. It is then transferred, without drying, into a water bath, and subsequently to isopropanol. Finally, the sample is carefully dried in air. The single- and few-layer graphene sheets remain suspended across the holes of the Quantifoil™ grid.

In other embodiments of the method, the graphene flakes prepared on a silicon substrate with a 300 nm thick silicon dioxide layer and a 10-30 nm layer of a suitable acrylate, such as polymethylmetacrylate (PMMA). A Quantifoil™ TEM grid is placed onto the flakes and pulled into contact with the surface by evaporation of a suitable solvent, such as an organic solvent, such as isopropanol. Contact between the flake and the grid can be improved by heating on a hot plate. The top layer of the substrate is then dissolved in a bath of another suitable solvent, such as an organic solvent, such as acetone or methylpyrrolidone. The TEM grid with the graphene flake is then separated from the substrate. It is can then be transferred to isopropanol again before drying. These methods avoid the use of any acid or base (such as potassium hydroxide).

Just before insertion into a TEM, the graphene membrane samples are again heated on a hot plate to reduce the amount of adsorbates that are present on the sample surface due to the wet preparation and due to air exposure. For the results shown here, samples were heated for 10 minutes at 200° C. This treatment reduces the rate of carbon deposition in EBID, which makes it easier to control at the expense of a longer writing time.

Figure 2:
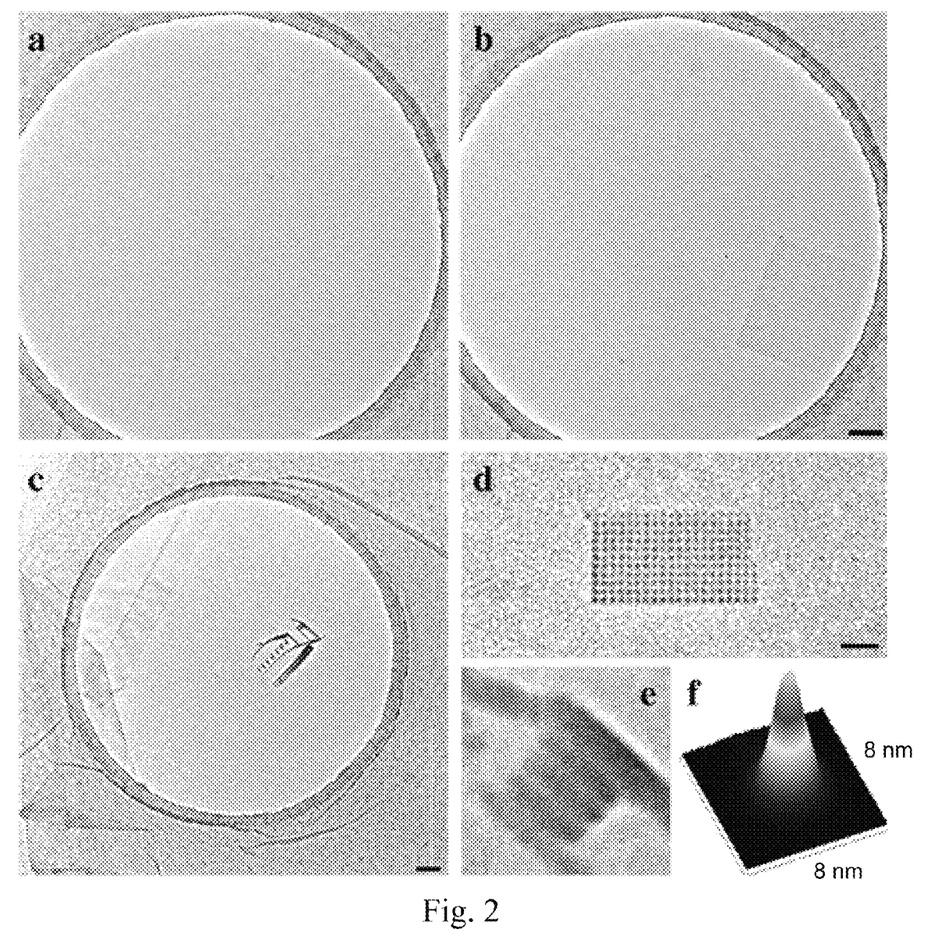
Figure 3:
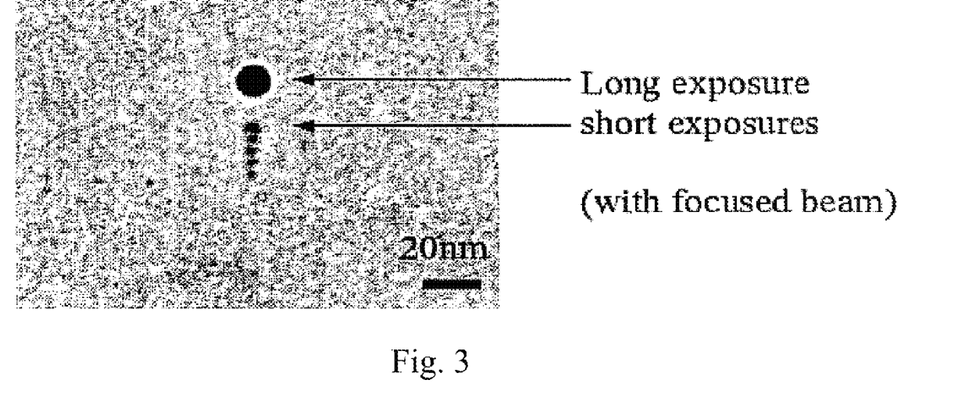
FIG. 3 provides a TEM image of the smallest points written on a graphene membrane by a focused electron beam.

Method of depositing carbon on the graphene having a resolution of 2.5 nm or less A JEOL 2010 Advanced High Performance TEM operated at 100 kV to write patterns on a graphene membrane. A small beam is formed in the convergent-beam diffraction mode of the illumination system, with a FWHM of 2.5 nm and a total current of approximately IpA (FIG. 2, Panel f). The advantage of using a TEM for this process is that the shape and size of the beam can be observed directly; however, we note that a nanometer-sized beam can be generated with any high quality scanning electron microscopy and lithography system as well. By employing a computer controlled movement of the electron beam, arbitrary patterns are created. In contrast to the "digital" nature of resist based lithography, we have here a continuous, "grayscale" control of the deposited amount of material.

FIG. 2, Panels a and b show the same graphene membrane before and after writing a periodic dot array. FIG. 2, Panel c shows a different membrane with a non-periodic pattern, the logo of the Lawrence Berkeley National Laboratory. The windows of the clock tower on the right-most part of the pattern are spaced only 10 nm apart (FIG. 2, Panel e). A carbon pattern obtained in this way is a dot array with a spacing of 5 nm (i.e. a half pitch of 2.5 nm), as shown in FIG. 2, Panel d. Here, the dwell time at each point was one second. The precursors in the EBID process are hydrocarbons adsorbed on the sample surface, as evidenced by the fact that the amount and time of heating the sample before insertion into the TEM strongly affects the deposition rate. The heating reduces the EBID rate (increases write time) but makes it more controllable for smallest structures.

The present invention also provides for method of detecting structures on a graphene membrane. This method is a tremendous advance in microscopy methods and can be used to detect and observe individual atoms, such as hydrogen atoms and carbon atoms, and individual small molecules, including their real-time dynamics, in a transmission electron microscope (TEM).

This method is derived not from building a better TEM, but rather by exploiting a new material configuration, a clean single-layer of a suspended graphene membrane, as a sample support membrane that, in effect, is invisible in the TEM. Adatoms and other adsorbates on this single-atom-thick membrane can be seen as if they were suspended in free space. Even hydrogen, the lightest element, is now easily imaged using only a modest-resolution TEM. The method can be reproduced in any basic microscopy laboratory in the world—no complex lithographic sample preparation is needed.

This method can be applied in all areas of research and technology development where very small particles and individual molecules are to be structurally identified, including nanomaterials, complex chemicals, or biological structures. This method also makes possible a study of real-time dynamics of such objects, with implications for examination of atomic interactions, chemical reactions, and defect formation and healing.

Applications of the Present Invention

The above results demonstrate a means to create arbitrary shapes on single- and few-layer graphene membranes with a resolution of 2.5 nanometers with continuous control over the amount of deposited material. This is a resolution that, by extrapolating from the international technology roadmap for semiconductors (ITRS), will be the DRAM half pitch in the year 2034. Indeed, if we consider the dots in FIG. 2, Panel d as bits for data storage, we have an extremely high information density per volume due to the ultrathin substrate: If the entire English Wikipedia (1 GB of text) were written onto graphene, the sheet could be folded or rolled into a cube with an edge length of only 5 micrometers (taking into account a height of the dots of 5 nm). Unlike patterns written by scanning tunneling microscopy atomic manipulation techniques which exist only at cryogenic temperatures, these graphene information patterns are stable at room temperature with an expected lifetime of many thousands of years.

Given the high sensitivity of graphene's electronic properties to small-scale perturbations, our deposited material will have a significant effect on the local electronic structure of the graphene membrane. An individual deposited dot will thus act as a spatially controlled scattering center. It is then easy to conceive of waveguide and optics analogies, e.g., a diffraction grating, for the charge carrier waves. Indeed, the dimensions of our structures are well matched to the wavelength of the electrons in graphene of ca. 4.26 nm. We anticipate that the ability to create also non-periodic, arbitrary shapes will lead to a wide range of interesting experiments. As previously mentioned, it has also been demonstrated that, by a suitable choice of the precursor, a wide range of materials other than carbon can be deposited by EBID. In this way, it should be possible to create specific doping patterns on graphene. In addition, EBID-deposited amorphous carbon can be used as an etch mask, pointing to a way to "cut out" a pre-selected structure from a graphene sheet.

The suspended graphene membrane of the present invention is useful for numerous applications. Such applications include, but are not limited to, high-volume commercial products and specialized research tools, such as electron microscopy support and further investigation into the properties of graphene. The graphene membrane of the present invention can be used as a support in TEM imaging. Also, the present invention provides for a direct visualization of individualized carbon adatoms, vacancies, carbon chains and monolayer adsorbates and their dynamics on graphene membranes by TEM. Using a single-layer graphene membrane, there is no background signal at all from the support membrane and adsorbates can be seen as if they were suspended in free space. One can study the dynamics of individual adatoms, vacancies, larger adsorbates as well as the formation of nanometer-sized holes in the electron beam. Graphene membranes provide a means to study the dynamics of chemical reactions or identify the structure of unknown adsorbates with potentially atomic resolution. In addition, the study of atomic scale defects and edges in graphene layers may provide insights on how to alter their electronic properties.

The suspended graphene membranes is particularly useful for nanoelectromechanical systems (NEMS) applications. The suspended graphene membranes can serve as sensitive chemical detectors, as part of a tuned electromechanical circuit and filter, as a basis for nanoelectronics or nanothermal devices, or the like.

The electron-beam induced deposition on graphene of the present invention can be used to create nanometer-scale doping patterns, diffraction gratings, or etch masks in this novel electronic material.

The invention having been described, the following examples are offered to illustrate the subject invention by way of illustration, not by way of limitation.

Example 1

Method of Suspending a Graphene Membrane

Figure 1:
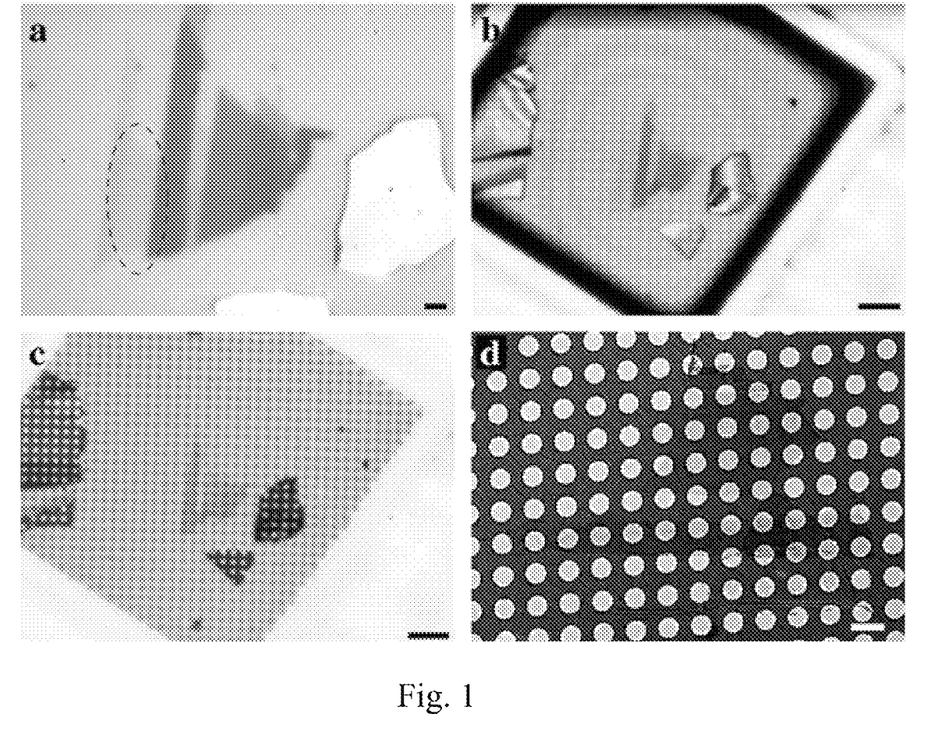

Our experimental procedure begins with graphene flakes made by the established "scotch tape" method. In order to suspend graphene membranes, we have developed transfer processes of the graphene flakes to commercially available electron microscopy grids (Quantifoil 200 Mesh gold grids with 1.3 μm holes in the carbon film). In the first method, we start with graphene flakes on a silicon substrate with a 300 nm silicon dioxide layer. We identify graphene flakes by optical microscopy (FIG. 1, Panel a), and place the Quantifoil grid onto the flake. A small drop of isopropanol is added (FIG. 1, Panel b) and left to evaporate. The surface tension of this solvent during evaporation pulls the perforated carbon film into contact with the substrate and graphene flakes (FIG. 1, Panel c). To improve the adhesion, we now heat the sample on a hot plate at 200° C. for 5 minutes. After cooling, we place the substrate with the now well-sticking TEM grid into a 30% solution of semiconductor grade potassium hydroxide at room temperature. The silicon dioxide layer is slowly etched by the potassium hydroxide, and the TEM grid along with the graphene sheets falls off after a time ranging from a few minutes to a few hours. It is then transferred, without drying, into a water bath, and subsequently to isopropanol. Finally, the sample is carefully dried in air. The single- and few-layer graphene membranes remain suspended across the holes of the Quantifoil grid.

Example 2

Method of Suspending a Graphene Membrane

In another method, we begin with graphene flakes prepared on silicon substrates with a 300 nm silicon dioxide layer and a 10-30 nm layer of polymethylmetacrylate (PMMA). Again, the Quantifoil TEM grid is placed onto the flakes and pulled into contact with the surface by evaporation of a solvent (isopropanol). Contact is improved by heating on a hot plate. The top layer of the substrate is now dissolved in a bath of acetone or methylpyrrolidone. After separating the TEM grid with the graphene flakes from the substrate, it is again transferred to isopropanol before drying. This second method avoids the use of acids or bases (such as potassium hydroxide).

Just before insertion into the TEM, the graphene membrane samples are again heated on a hot plate to reduce the amount of adsorbates that are present on the sample surface due to the wet preparation and due to air exposure. For the results shown here, samples were heated for 10 minutes at 200° C. We clearly observe that this treatment reduces the rate of carbon deposition in EBID, which makes it easier to control at the expense of a longer writing time.

We use a JEOL 2010 TEM operated at 100 kV to write the patterns. A small beam is formed in the convergent-beam diffraction mode of the illumination system, with a FWHM of 2.5 nm and a total current of approximately 1 pA (FIG. 2, Panel f). The advantage of using a TEM for this process is that the shape and size of the beam can be observed directly; however, we note that a nanometer-sized beam can be generated with any high quality scanning electron microscopy and lithography system as well. By employing a computer controlled movement of the electron beam, arbitrary patterns are created. In contrast to the "digital" nature of resist based lithography, we have here a continuous, "grayscale" control of the deposited amount of material.

FIG. 2, Panels a and b show the same graphene membrane before and after writing a periodic dot array. FIG. 2, Panel c shows a different membrane with a non-periodic pattern, the logo of the Lawrence Berkeley National Laboratory. The windows of the clock tower on the right-most part of the pattern are spaced only 10 nm apart (FIG. 2, Panel e). The smallest carbon pattern we obtained in this way is a dot array with a spacing of 5 nm (i.e. a half pitch of 2.5 nm), as shown in FIG. 2, Panel d. Here, the dwell time at each point was one second. The precursors in the EBID process are hydrocarbons adsorbed on the sample surface, as evidenced by the fact that the amount and time of heating the sample before insertion into the TEM strongly affects the deposition rate. The heating reduces the EBID rate (increases write time) but makes it more controllable for smallest structures.

The above results demonstrate a means to create arbitrary shapes on single- and few-layer graphene membranes with a resolution of 2.5 nanometers with continuous control over the amount of deposited material.

Example 3

Imaging and Dynamics of Carbon and Hydrogen Atoms on Graphene

Observing the individual building blocks of matter is one of the primary goals of microscopy. The invention of the scanning tunneling microscope revolutionized experimental surface science in that atomic-scale features on a solid-state surface could finally be readily imaged. However, scanning tunneling microscopy has limited applicability due to restrictions, for example, in sample conductivity, cleanliness, and data acquisition rate. An older microscopy technique, that of transmission electron microscopy (TEM) has benefited tremendously in recent years from subtle instrumentation advances, and individual heavy (high atomic number) atoms can now be detected by TEM even when embedded within a semiconductor material. However, detecting an individual low atomic number atom, for example carbon or even hydrogen, is still extremely challenging, if not impossible, via conventional TEM due to the very low contrast of light elements. Here we demonstrate a means to observe, by conventional transmission electron microscopy, even the smallest atoms and molecules: On a clean single-layer graphene membrane, adsorbates such as atomic hydrogen and carbon can be seen as if they were suspended in free space. We directly image such individual adatoms, along with carbon chains and vacancies, and investigate their dynamics in real time. These techniques open a way to reveal dynamics of more complex chemical reactions or identify the atomic-scale structure of unknown adsorbates. In addition, the study of atomic scale defects in graphene may provide insights for nanoelectronic applications of this interesting material.

The atomic-scale resolution of TEM comes at the price of requiring that the transmitted electron beam reach the imaging lenses and detector, and therefore TEM works only for ultra thin, electron transparent samples. In high-resolution transmission electron microscopy (HRTEM) and all related techniques such as electron diffraction, scanning transmission electron microscopy (STEM), electron energy loss spectroscopy, or elemental mapping, any support film or membrane provides a background signal that is most significant for the smallest objects under investigation. Individual nanoscale particles or molecules usually need to be supported by a continuous membrane, as only tubular or rod-shaped nanoparticles (such as carbon nanotubes) can be suspended across holes in the membrane. Indeed, single-walled carbon nanotubes (SWNTs) have been utilized for low-background TEM studies of encapsulated molecules or defects in the cylinder-shaped graphene sheets. However, the limited space, harsh filling procedures, and strongly curved shape of the sheet limit the applicability and complicate the analysis.

As we demonstrate below, a graphene membrane provides the ultimate sample support for electron microscopy: with a thickness of only one atom, it is the thinnest possible continuous material. This, together with the low atomic number of its constituent atoms, results in a minimum in inelastic scattering contributions. Due to its crystalline nature, a graphene support membrane is either completely invisible or, if the graphene lattice is resolved by a very-high-resolution microscope, its contribution to the imaging signal can be easily subtracted. Graphene is also a good electrical conductor and therefore displays minimal charging effects from the electron beam. Remarkably, we find that a graphene membrane enables single adatom sensitivity even when using a common TEM that does not resolve a graphitic lattice.

Figure 4:
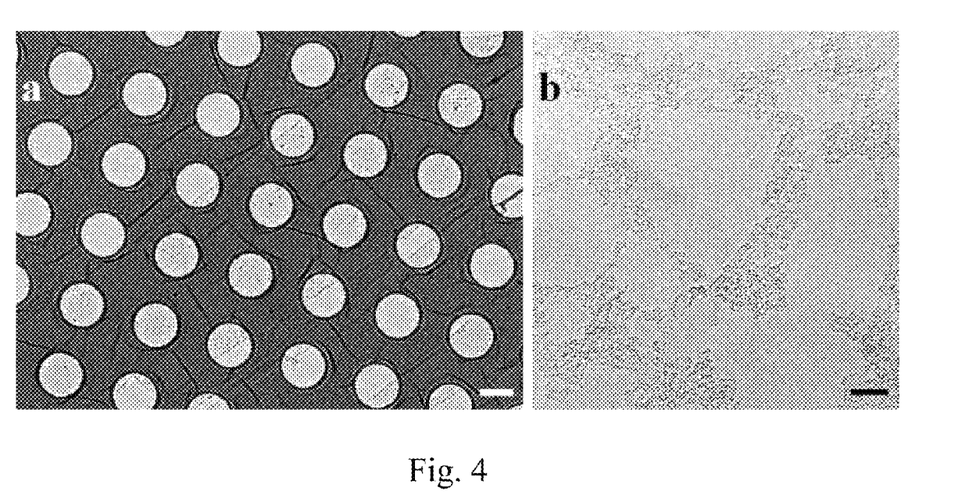

Preparation of our free-standing graphene support membranes is described in the supplementary information. In order to observe adsorbates at the single-atom level, the graphene support membrane must be exceptionally clean. In contrast to an earlier graphene preparation method, taught in Meyer, J. C., et al., The structure of suspended graphene sheets, *Nature,* 446, 60-63 and in the supplementary information to this publication (doi: 10.1038/nature05545), our approach does not rely on electron beam lithography and is simple enough to be reproducible in any basic microscopy laboratory. In brief, we start with graphene cleaved onto a substrate using an adhesive tape. Graphene pieces are identified by optical microscopy, and subsequently transferred to Quantifoil™ TEM grids. We use electron diffraction analysis as described in Meyer et al. to verify the presence of a single layer. FIG. 4a shows a low magnification view of a graphene sheet suspended across the 1.3 µm holes of the perforated carbon foil, with a close-up shown in FIG. 4b. More than 50% of the area on these graphene membranes appears exceptionally clean, with no dramatic contrast in high-resolution TEM images (FIG. 4b). As we now demonstrate, however, these "clean" regions contain individual adatoms that are readily observable by TEM. Although individual exposures can reveal useful data, a dramatic improvement in the signal-to-noise ratio is achieved by summing multiple subsequent frames (corrected for sample drift), which effectively increases the exposure time beyond the dynamic range of the TEM CCD detector. Summing as few as 5 frames yields striking visual improvement with atomic-scale features (including individual atoms) becoming readily apparent, and summing 100 frames reduces the noise to below 0.12% (standard deviation in a relatively featureless region of the graphene membrane).

Figure 5:
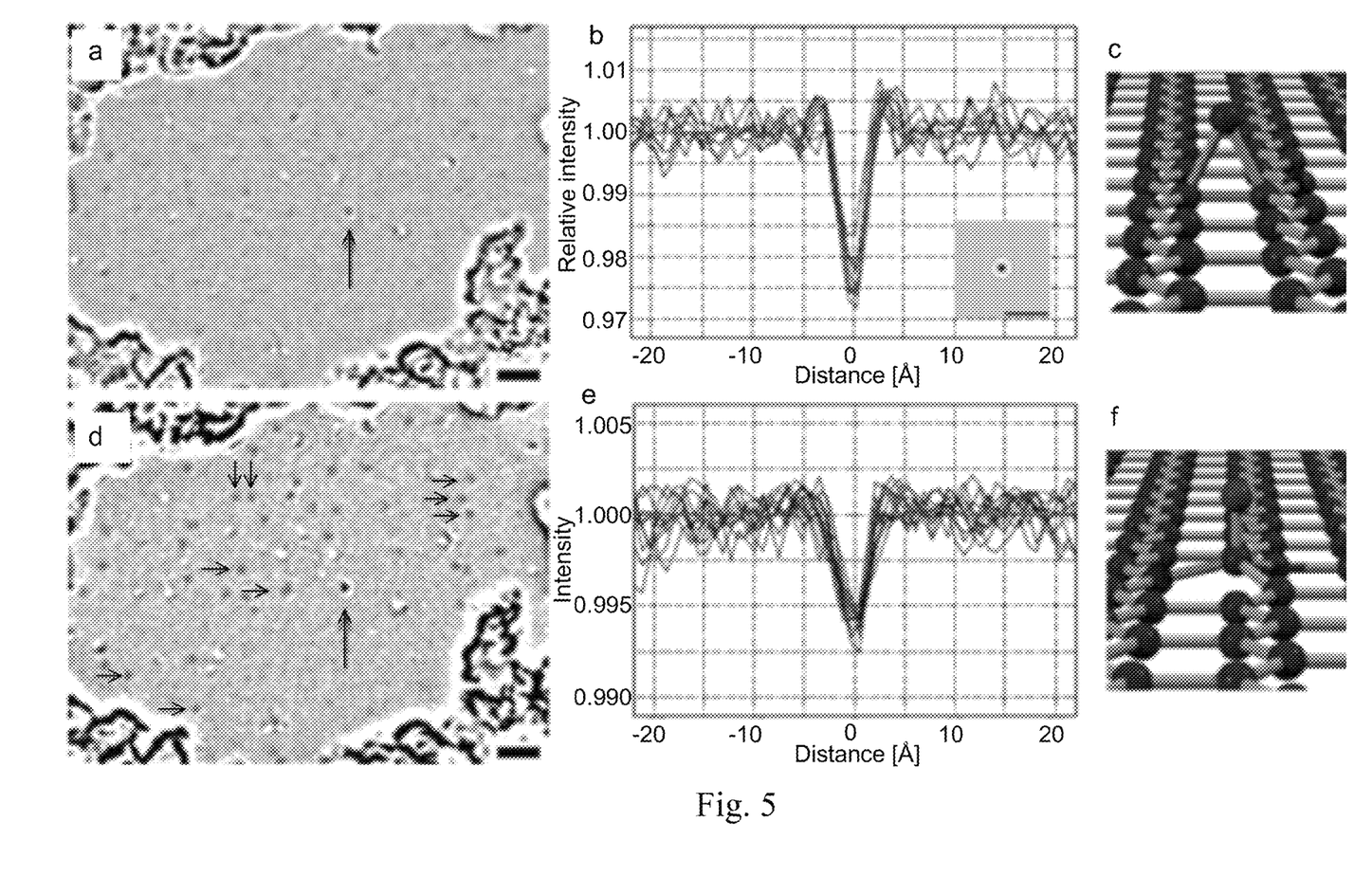

FIG. 5a shows a TEM image in which an individual carbon atom, attached to the graphene membrane, is identified by an arrow. We recorded eight consecutive, essentially identical images to that of FIG. 5a (each a summation of 20 frames on the CCD), demonstrating that the carbon atom did not adsorb or desorb during the time of exposure. To identify the adatom, image simulations were carried out using the electron atomic scattering factors of Doyle, P. A., et al., Relativistic hartree-fock x-ray and electron scattering factors, *Acta Cryst. A,* 24, 390 (1968) and Peng, L. M., Electron atomic scattering factors and scattering potentials of crystals. *Micron,* 30, 625 (1999) for carbon, as shown in FIG. 5b. The good agreement between the TEM data and image simulation confirms the carbon atom identification.

Closer inspection of FIG. 5a indicates not only additional similar carbon adatoms, but also faint atomic-scale structure distinctly different from carbon adatoms. To highlight these faint features, we show in FIG. 5d a summation of 100 consecutive TEM frames for the same physical region. In this representation the carbon adatoms display sharp contrast at the saturation of the gray level scale. FIG. 5d reveals a moderate density of additional dark features (dark gray points, a selection of which are identified with red arrows) with identical intensity profiles, all with a central dip reduction near 0.6% of the mean bright-field intensity (FIG. 5e). By comparing the TEM image data for these additional features to adatom simulations, we rule out any adatom heavier than helium, as well as a substitution of carbon atoms in the graphene membrane by other elements. However, a hydrogen adatom, based on the electron scattering factors of Peng (referenced above), results in precisely the correct 0.6% dip in the bright-field intensity, shown by the red curve in FIG. 5e. The large number of essentially identical adatom profiles, along with the excellent agreement with the simulated contrast, provides convincing evidence that we have, for the first time, detected individual hydrogen atoms by transmission electron microscopy.

Figure 6:
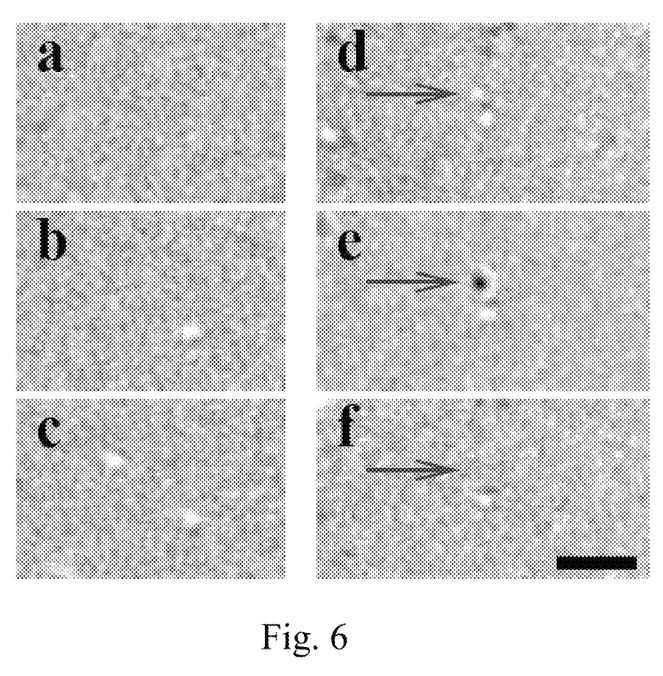
Figure 7:
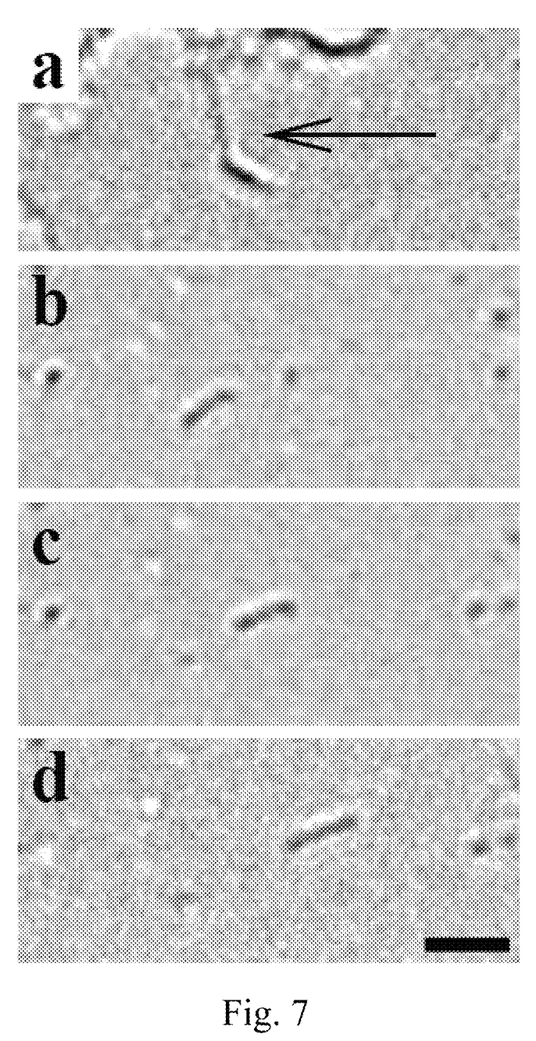

In addition to individual adatoms, we observe by the same TEM imaging methods the generation (by the electron beam) and dynamics of defects (vacancies) in the graphene membrane, as well as the dynamics of a variety of molecular-scale adsorbates. The formation of vacancies due to knock-on damage by the electron beam is shown in FIGS. 6a-c. We also observe vacancies that disappear by interaction with mobile adsorbates. Larger adsorbates (small molecules) become trapped preferentially at defects, and can be observed at one position for typically one to five minutes. Frequently, we see that the vacancy disappears along with the trapped adsorbate (FIG. 6d-f), and the missing carbon atom has obviously been resubstituted from the adsorbate. Further, we can directly observe linear molecules on graphene membranes (FIG. 7) that resemble an individual alkane or alkene carbon chain. These molecules are found to spontaneously appear in the field of view, presumably adsorbed onto the graphene membrane from the vacuum contamination. We can follow their dynamics for a few minutes until they decompose in the electron beam, as shown in FIG. 7b-d.

The remarkable TEM imaging capability afforded by a suspended, single graphene membrane warrants further discussion. For an ideal graphene sheet, there are no components in the structure with a period larger than 2.1 Å, which is beyond the information limit of approximately 2.9 Å for the microscope used in the present studies (JEOL 2010 operated at 100 kV). Therefore, although the ideal graphene membrane cannot be resolved under these conditions, any perturbation to the crystalline structure can be detected as long as a sufficient number of electrons can be recorded for statistical significance. Indeed, our graphene membranes are highly stable in the electron beam at 100 kV, allowing long data collection times on one region. For example, all images in FIGS. 5-7 are recorded from graphene membranes after between one and three hours of irradiation (at ca. 7A/cm2). Moreover, the summation of 100 consecutive CCD frames corresponds to an exposure time of 20 minutes, and distortions in the membrane during this time are below the resolution limit. This combination of a crystalline, atomically thin membrane along with the high beam stability and the absence of an amorphous background signal on the nominally clean membrane enable this unprecedented single-light-atom sensitivity in TEM. In comparison, single-walled carbon nanotubes (SWNTs) show strong deformations under the same dose and energy of electron irradiation, probably because the cylindrical geometry allows beam-induced defects to relax via local deformations more easily.

The observation of stable and well-localized hydrogen adatoms on graphene, in spite of the irradiation and room temperature conditions, imply that these are chemisorbed rather than physisorbed atoms. Strong bonding of hydrogen to graphite is possible if the nearest carbon atom changes its bonds from sp2 to sp3 configuration, with the carbon atom displaced from the plane by about 0.36 Å (FIG. 5f). Moreover, it was found that hydrogen cannot bind to graphene if the carbon is confined to a plane (e.g. by strong bonding to a substrate), while an isolated membrane can deform easily to accommodate different types of bonds. From the observed density of hydrogen adatoms, we conclude that only about 0.3% of the carbon atoms in the graphene membrane are in an sp3 configuration with a hydrogen adatom.

Our real-time observation of molecular dynamics has important implications for chemical diffusion and reaction dynamics studies. As demonstrated above, a variety of molecular scale adsorbates become trapped on the membrane, and often detach again or decompose after a few minutes. We can observe individual alkane-type molecules and we can even follow their migration. Observing this kind of molecule in the TEM has important implications because it represents an essential ingredient of organic chemistry. It therefore appears likely that other, more complex, molecules can be observed after deposition on graphene membranes. We find that the carbon chains are sufficiently stable and localized for characterization even at room temperature, and note that these adsorbates were only trapped on the membrane after a moderate density of defects had been created by irradiation.

In conclusion, we have demonstrated that graphene membranes enable a TEM visualization of ultra-low contrast objects. The imaging of individual hydrogen and carbon adatoms and carbon chains demonstrates a new level of sensitivity that is relevant for organic materials. A key strength of the TEM is its ability to image individual entities rather than averaging over an ensemble, and direct imaging promises insights ranging from the characterization of complex chemicals and nanomaterials to biological molecules. The extremely high sensitivity that a graphene membrane in the transmission electron microscope provides with respect to adsorbates has allowed us to detect even hydrogen, demonstrating the ultimate in TEM atomic sensitivity. While the study of defects, vacancies and edges of the graphene sheet itself will provide insights for potential electronic modifications of this new material, the placement of objects on graphene membranes will enable unprecedented analysis by TEM, including electron spectroscopic analysis, and the study of molecular dynamics.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A method of suspending graphene on a pre-fabricated support structure comprising:
    attaching the graphene to a substrate;
    placing the pre-fabricated support structure having a gap on the graphene;
    immersing the pre-fabricated support structure and the graphene in a solvent;
    evaporating the solvent to attach the pre-fabricated support structure to the graphene; and
    separating the graphene and the pre-fabricated support structure from the substrate, leaving the graphene suspended on the pre-fabricated support structure.

2. The method of claim 1 further comprising separating the graphene from bulk graphite prior to attaching the graphene to the substrate.

3. The method of claim 1 wherein separating the graphene and the pre-fabricated-support structure from the substrate comprises placing a solvent adjacent to an edge of the pre-fabricated support structure, and wherein the solvent expands beneath the pre-fabricated support structure and the graphene which causes the pre-fabricated support structure with the graphene suspended on it to separate from the substrate.

4. The method of claim 1 further comprising heating the pre-fabricated support structure including the graphene suspended across the gap after separating the pre-fabricated support structure and the graphene from the substrate.

5. The method of claim 1 wherein the pre-fabricated support structure comprises a transmission electron microscopy grid.

6. The method of claim 1 wherein the pre-fabricated support structure comprises a plurality of gaps, and wherein separating the graphene and the pre-fabricated support structure from the substrate leaves the graphene suspended across at least two of the gaps on the pre-fabricated support structure.

7. The method of claim 1, wherein the graphene is suspended across the gap in the pre-fabricated support structure.

8. The method of claim 1 wherein attaching the graphene to the substrate comprises attaching the graphene to a sacrificial surface of the substrate.

9. The method of claim 8 wherein separating the graphene and the pre-fabricated support structure from the substrate comprises etching the sacrificial surface by immersing the sacrificial surface and the graphene in an etch solution.

10. The method of claim 9 wherein the sacrificial surface comprises silicon dioxide.

11. The method of claim 10 wherein the etch solution comprises potassium hydroxide.

12. The method of claim 9 wherein the sacrificial surface comprises polymethyl methacrylate.

13. The method of claim 12 wherein the etch solution comprises an organic solvent.

14. The method of claim 13 wherein the organic solvent is selected from the group consisting of acetone and methylpyrrolidone.

15. A method comprising:
attaching graphene to a substrate;
applying an adhesive to a surface of a pre-fabricated support structure, the pre-fabricated support structure defining a gap;
bringing the adhesive into contact with the graphene; and
separating the graphene and the pre-fabricated support structure from the substrate, leaving the graphene suspended on the pre-fabricated support structure.

16. The method of claim 15 wherein separating the graphene and the pre-fabricated support structure from the substrate comprises pulling the pre-fabricated support structure away from the substrate which leaves the graphene attached to the pre-fabricated support structure by the adhesive.

17. The method of claim 16 further comprising immersing the graphene and the pre-fabricated support structure in a solvent to remove excess adhesive.

* * * * *